US010553394B2

(12) United States Patent
Jedidi et al.

(10) Patent No.: US 10,553,394 B2
(45) Date of Patent: Feb. 4, 2020

(54) METHOD FOR THE CORRECTION OF ELECTRON PROXIMITY EFFECTS

(71) Applicant: ASELTA NANOGRAPHICS, Grenoble (FR)

(72) Inventors: Nader Jedidi, Lausanne (CH); Patrick Schiavone, Villard Bonnot (FR); Jean-Hervé Tortai, La Tronche (FR); Thiago Figueiro, Grenoble (FR)

(73) Assignee: ASELTA NANOGRAPHICS, Grenoble (FR)

( * ) Notice: Subject to any disclaimer, the term of this patent is extended or adjusted under 35 U.S.C. 154(b) by 0 days.

(21) Appl. No.: 14/915,288

(22) PCT Filed: Aug. 28, 2014

(86) PCT No.: PCT/FR2014/052139
§ 371 (c)(1),
(2) Date: Feb. 29, 2016

(87) PCT Pub. No.: WO2015/028753
PCT Pub. Date: Mar. 5, 2015

(65) Prior Publication Data
US 2016/0211115 A1    Jul. 21, 2016

(30) Foreign Application Priority Data

Aug. 28, 2013 (FR) ..................................... 13 02001

(51) Int. Cl.
*H01J 37/304*    (2006.01)
*H01J 37/285*    (2006.01)
*H01J 37/317*    (2006.01)

(52) U.S. Cl.
CPC .......... *H01J 37/304* (2013.01); *H01J 37/285* (2013.01); *H01J 37/3175* (2013.01); *H01J 2237/2487* (2013.01)

(58) Field of Classification Search
None
See application file for complete search history.

(56) References Cited

U.S. PATENT DOCUMENTS

| 5,035,113 | A  | * | 7/1991 | Simonyi ............... F16H 59/044 192/3.58 |
| 6,035,113 | A  |   | 3/2000 | Gerber et al. |
| 2003/0093767 | A1 | * | 5/2003 | Murai .................... B82Y 10/00 430/30 |
| 2006/0183025 | A1 | * | 8/2006 | Yang ........................ G03F 1/78 430/5 |

(Continued)

FOREIGN PATENT DOCUMENTS

EP    2560187 A1    2/2013

OTHER PUBLICATIONS

Mar. 10, 2016 International Search Report issued in International Patent Application No. PCT/FR2014/052139.

(Continued)

*Primary Examiner* — Andrew Smyth
(74) *Attorney, Agent, or Firm* — Oliff PLC

(57) ABSTRACT

A method for projecting an electron beam onto a target includes correction of the scattering effects of the electrons in the target. This correction is made possible by a calculation step of a point spread function having a radial variation according to a piecewise polynomial function.

14 Claims, 2 Drawing Sheets

(56) References Cited

U.S. PATENT DOCUMENTS

| | | | |
|---|---|---|---|
| 2007/0194250 A1* | 8/2007 | Suzuki | B82Y 10/00 250/492.2 |
| 2008/0067446 A1* | 3/2008 | Belic | B82Y 10/00 250/492.22 |
| 2010/0237469 A1* | 9/2010 | Saito | B82Y 10/00 257/618 |
| 2013/0043389 A1* | 2/2013 | Schiavone | G03F 7/2061 250/310 |

OTHER PUBLICATIONS

Jan. 5, 2015 Search Report issued in International Patent Application No. PCT/FR2014/052139.

* cited by examiner

METHOD FOR THE CORRECTION OF ELECTRON PROXIMITY EFFECTS

BACKGROUND OF THE INVENTION

The invention relates to fields using the interaction of an electron beam with a target, in particular the fields of electron beam lithography and electron microscopy.

STATE OF THE ART

The interaction of an electron beam with a solid target is a physical phenomenon that is taken advantage of in several technical fields. Electron beam lithography for example uses an electron beam to form a pattern on a substrate. This technique has enabled an improvement of the spatial resolution for the patterns made on a substrate, thus contributing to miniaturization of integrated circuits. Furthermore, electron bombardment can also be used for analysis of a solid target. Depending on the type of analysis required, an electron beam having a predefined energy and dose can be used as incident beam. Quantification of the radiative and/or corpuscular emissions then for example enables the topography, composition, cathodoluminescence, etc. of the target bombarded by the incident electron beam to be determined.

For a better use of the interaction of an electron beam with a target, a precise modelling of this interaction is then necessary. Furthermore, when bombardment of a solid target is performed with an electron beam, physical phenomena qualified as proximity effects, or diffusion effects, can impair the quality of this modelling.

Proximity effects are generated by forward scattering and back scattering of the electrons around the initial path. The proximity effects depend in particular on the composition and on the geometry of the target, and on the characteristics of the electron beam. It is thus necessary to take account of the proximity effects to obtain a faithful and precise modelling of the interaction of the electron beam with the target.

A function called Point Spread Function (PSF) is generally used, in particular to take account of the proximity effects. A PSF function can for example describe the variation of the dose (i.e. the quantity of energy per surface unit) received at a point of the target versus the distance r separating this point from the point of incidence of the electron beam.

In the field of electron beam lithography, the dose deposited in the target is then calculated by convolution of the PSF function with the geometric shape defining the pattern to be performed.

One of the most widely used PSF functions is a combination of a first Gaussian modelling the forward scattering effect and a second Gaussian modelling the back scattering effect.

The conventional Gaussian-based PSF function is represented by the following function:

$$f(r) = \frac{1}{\pi(1+\eta)}\left(\frac{1}{\alpha^2}e^{-r^2/\alpha^2} + \frac{\eta}{\beta^2}e^{-r^2/\beta^2}\right) \quad (1)$$

where $\alpha$ represents the width of the forward scattered radiation, $\beta$ represents the width of the back scattered radiation, $\eta$ represents the ratio between the intensity of the forward and back scattered radiations, and r represents the radial position of a point with respect to the point of incidence of the electron beam.

The parameters $\alpha$, $\beta$ and $\eta$ can be determined experimentally. These parameters depend on the characteristics of the electron beam and on the nature of the target.

Using the PSF function given by equation 1, very significant deviations are observed between the energy distribution around the point of impact given by this PSF function and that obtained by experimental measurements or by using a Monte-Carlo simulation, which is one of the reference models.

Furthermore, American Patent application US2008/0067446 discloses an electron beam lithography method comprising a proximity effect correction step. The PSF function used in this method comprises a combination of at least three Gaussians able to have negative weighting coefficients.

OBJECT OF THE INVENTION

In certain technical fields, in particular that of electron beam lithography and of electron microscopy, there would be a requirement for a method for projecting an electron beam that is precise and easy to perform.

This requirement tends to be met by providing a method for projecting an electron beam onto a target comprising correction of the scattering effects of the electrons in the target. The correction comprises a step of computing a point spread function having a radial variation according to a piecewise polynomial function.

Advantageously, correction of the scattering effects of the electrons in the target comprises modulation of the dose deposited in the target and/or of the geometry of the portion of the target receiving the electron beam.

In preferential manner, the radial variation of the point spread function is a piecewise cubic polynomial. Advantageously, this radial variation is defined over an interval [a, b] belonging to the set of real numbers RR, and complies with the limit conditions called natural so that the second derivatives of the radial variation at the end to the interval [a, b] are zero.

According to one embodiment, the piecewise polynomial function is defined by coefficients $(\alpha_{i,j})$, said coefficients being chosen so as to optimize the interpolation of the result of a reference probabilistic simulation of the scattering of the electrons originating from the electron beam in the target, by the radial variation of the point spread function.

According to another embodiment, said coefficients $(\alpha_{i,j})$ are chosen so as to optimize the interpolation of the experimental results representing the scattering of the electrons originating from the electron beam in the target, by the radial variation of the point spread function.

An electron beam lithography device is also provided comprising:
- a module for accelerating and projecting an electron beam onto a target;
- a computing module configured to correct the scattering effects of the electrons in said target;

wherein the computing module is configured to compute a point spread function having a radial variation according to a piecewise polynomial function so as to optimize the distribution of the dose deposited in the target and/or the geometry of the portion of the target receiving the electron beam.

In advantageous manner, the computing module of the electron beam lithography device is configured to optimize the distribution of the dose deposited in the target by a calculation comprising a convolution of the point spread function and of the geometry of the pattern to be etched.

Furthermore, an electron microscopy device is provided comprising:
- a module for accelerating and projecting an incident electron beam onto a target;
- a display module of a signal describing the target;
- a computer configured to optimize a global point spread function from the correction of the scattering effects of the incident electrons in the target, correction of the scattering effects of the incident electrons in the target comprising a step of computing an additional point spread function having a radial variation according to a piecewise polynomial function; and
- a processing module of the re-emitted signal resulting from the interaction of the incident electron beam with the target, the module being configured to correct the signal describing the target using a deconvolution calculation of the signal re-emitted by the target and said global point spread function.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
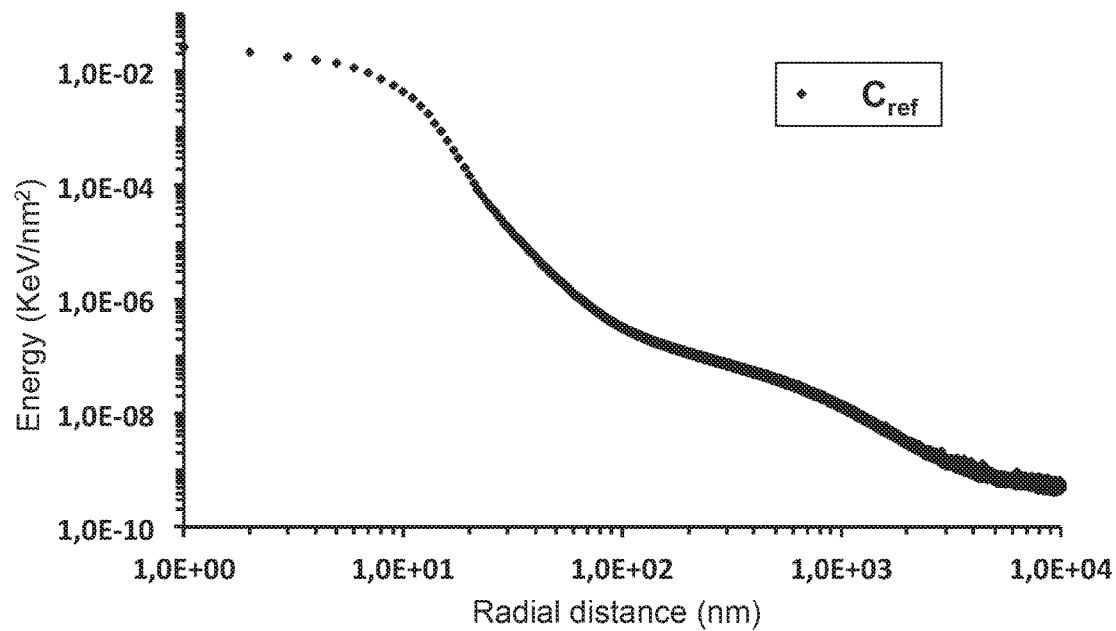
FIG. 1 represents the plot of the radial variation $PSF_{ref}(r)$ of a reference point spread function $PSF_{ref}$ calculated by means of a Monte-Carlo simulation.

Controlled use of an incident electron beam on a target requires the different physical phenomena generated by this interaction to be taken into account, in particular the electron beam proximity effects.

For a precise and easily achievable modelling of the interaction of an electron beam with a target, it is particularly advantageous to use a point spread function (PSF) which can be rapidly parameterized and calculated. It is also advantageous for the PSF function to be chosen so as to be as realistic as possible by making a fit, for example of the experimental results and/or one of the reference models, for example the one using a Monte-Carlo method.

This object tends to be achieved by choosing a class of PSF functions having a radial variation that is a piecewise polynomial function, commonly referred to as spline.

According to a first embodiment, a method for projecting an electron beam onto a target comprises correction of the scattering effects of the electrons in the target, in other words the proximity effects.

To perform correction of the scattering effects, a point spread function, or PSF function, is first of all calculated. The calculated PSF function is configured to correct the energy distribution deposited in the target taking account of the effects called proximity effects.

Furthermore, the PSF function also takes account of the composition of the target. What is meant by composition of the target is the nature of the layers of the stack forming the target designed to be bombarded by the electron beam.

According to this embodiment, the point spread function used is advantageously a piecewise polynomial function, in other words a spline. The PSF function is then defined by a piecewise polynomial. This type of function is in advantageous manner easily parameterizable and can perform a precise interpolation of a set of experimental points.

For example purposes, a set of k discrete experimental points $(r_i, f(r_i)=y_i)$ to be interpolated or adjusted can be considered, where i is an integer index varying from 1 to k, k being an integer greater than or equal to 3. The k points $(r_i, f(r_i))$ are defined in an interval [a, b] of the set of real numbers $\mathbb{R}$. The interval [a, b] is thus divided into (k−1) sub-intervals $[r_i, r_{i+1}]$.

Each real number $r_i$ of index i is defined such as to satisfy the following equalities and inequalities:

$$r_1 = a < r_2 < \ldots < r_k = b \quad (2)$$

A piecewise polynomial function or spline s(r) is defined as follows:

$$s(r) = p_i(r)_{|[r_i, r_{i+1}]} \text{ for } i=1, \ldots, k-1 \quad (3)$$

where $p_i(r)$ is a polynomial of degree I. The spline s(r) is thus said to be of degree I, and it is therefore of class $C^{I-1}$ over the interval [a, b].

The polynomial $p_i(r)$ can be written according to the following formula:

$$p_i(r) = \alpha_{i,0} r^0 + \alpha_{i,1} r^1 + \ldots + \alpha_{i,(I-1)} r^{I-1} + \alpha_{i,I} r^I \quad (4)$$

Each polynomial $p_i(r)$ comprises (I+1) coefficients $\alpha_{i,j}$, where j is an integer varying from 0 to I. Thus, to define the spline s(r), (k−1).(I+1) coefficients $\alpha_{i,j}$ have to be determined. The piecewise polynomial function is thus defined by the coefficients $(\alpha_{i,j})$.

Furthermore, a spline function is defined so as to comply with the "collocation" conditions at the ends of the sub-intervals $[r_i, r_{i+1}]$. These conditions are the following:

$$p_i(r_i) = y_i \text{ for } i=1, \ldots, k-1 \quad (5)$$

$$p_i(r_{i+1}) = y_{i+1} \text{ for } i=1, \ldots, k-1 \quad (6)$$

$$p_i^{(j)}(r_{i+1}) = p_{i+1}^{(j)}(r_{i+1}) \text{ for } i=1, \ldots, k-2 \text{ and } j=1, \ldots, I-1 \quad (7)$$

These "collocation" conditions enable (2.(k−1)+(k−2).(I−1)) linear equations to be obtained with the different coefficients $\alpha_{i,}$ of the polynomials $p_i(r)$.

However, to define the spline s(r), all the coefficients $\alpha_{i,j}$ have to be determined, with i varying from 1 to k−1 and j varying from 0 to I. To be able to determine all the coefficients $\alpha_{i,j}$ of the spline s(r), (k−1).(I+1) linear equations are required. (I−1) additional linear equations are therefore lacking.

The missing equations are generally given by the limit conditions imposed on the spline function s(r).

Advantageously, the limit conditions enable a single solution to be obtained thereby defining the spline function. Thus, for a fitting operation of experimental points (($r_m$, $y_m$) for m=1, ..., n), the variables to be optimized are the values of $r_i$ chosen from the set of the n experimental points ($r_m$, $y_m$) to be adjusted. Furthermore, spline functions advantageously enable a precise interpolation of the experimental values, and they are easy to parameterize and to calculate.

According to a particular embodiment, correction of the electron scattering effects in the target comprises modulation of the dose deposited in the target.

After a PSF has been calculated having a radial variation according to a piecewise polynomial function, the distribution of the dose deposited in the target can in fact then be calculated by correcting the electron scattering effects in the target.

For example purposes, in the field of electron beam lithography, correction of the distribution of the deposited dose is determined by the convolution of the PSF and the geometric shape of the pattern to be etched.

According to another embodiment, correction of the electron scattering effects in the target comprises modulation of the geometry of the portion of the target receiving the electron beam. The deposited dose and/or the geometry of the target receiving the electron beam can thus be adjusted to obtain the required spatial distribution of the dose deposited in target with great precision.

These embodiments of the method described above can advantageously be used in an electron beam lithography method to correct the dose deposited in a layer of electronic resist. Such a correction advantageously enables the spatial resolution and/or the fidelity to the expected pattern and advantageously of the patterns developed from said electronic resist bombarded by the electron beam to be enhanced by controlling their shape and dimension with precision.

Furthermore, spline functions are easy to parameterize and to compute. The use of a spline as a PSF function thus advantageously makes it easier to perform a method for projecting an electron beam onto a target while at the same time correcting the electron scattering effects in the target.

Advantageously, the radial variation of the point spread function is a piecewise cubic polynomial of class $C^2$.

Furthermore, to determine all the coefficients of a cubic spline $s(r)$ defined over the interval $[a, b]$, two linear equations are required imposed by boundary conditions (at $r=a$ and $r=b$), in addition to the "collocation" conditions.

Three types of usual end conditions exist for cubic splines: Hermite conditions, periodic conditions and natural conditions. The Hermite conditions impose the following conditions:

$$s'(a)=f'(a) \text{ and } s'(b)=f'(b) \qquad (8)$$

where $f'(r)$ represents the derivative of the function $f(r)$ which the spline $s(r)$ is seeking to interpolate. These conditions assume that $f'(a)$ and $f'(b)$ are known.

The periodic conditions impose the following conditions:

$$s'(a)=s'(b) \text{ and } s''(a)=s''(b) \qquad (9)$$

Advantageously, the point spread function is defined over an interval $[a, b]$ belonging to the set of real numbers $\mathbb{R}$, and it complies with the limit conditions called natural conditions. In other words, the second derivative of the point spread function is zero at the ends of the interval $[a, b]$:

$$s''(a)=s''(b)=0 \qquad (10)$$

Imposing limit conditions called natural conditions on a cubic spline advantageously enables a spline to be obtained that does not have curvatures at the ends of the interval $[a, b]$. Furthermore, this type of limit conditions does not require any knowledge of the derivatives of the function to be interpolated.

Furthermore, spline functions advantageously allow a flexibility to adjust a given curve. Thus, for a PSF function to enable a correction of the scattering effects, it is more advantageous to use a radial variation of the PSF according to a spline than a combination of Gaussians or other type of function.

According to one embodiment, the piecewise polynomial function is defined by coefficients $(\alpha_{i,j})$ and the coefficients are chosen such as to optimize interpolation of the result of a reference simulation of the scattering of the electrons originating from the electron beam in the target, by the radial variation of the point spread function.

Furthermore, a simulation of probabilistic type was performed to calculate a reference point spread function $PSF_{ref}$. The latter can also be used to test the "flexibility" of fitting of a spline. A Monte-Carlo simulation of the scattering of the electrons originating from an electron beam in a target was performed to calculate the $PSF_{ref}$ function. Then the radial variation $PSF_{ref}(r)$ of the $PSF_{ref}$ function was interpolated by a function of spline type and a combination of Gaussians. Furthermore, the reference point spread function $PSF_{ref}$ can be determined from measurements. Fitting by functions of spline type and combination of Gaussians can thus be performed based on these measurements.

An interaction of an electron beam with a diameter of about 30 nm generated by an acceleration voltage of 100 kV was studied. In this example, the electron beam interacts with a stack configured to form a lithography mask in the extreme ultraviolet. The stack successively comprises a substrate made from silicon oxide, a layer of molybdenum silicide, and a layer of electronic resist configured to be bombarded by the electron beam.

FIG. 1 illustrates the radial variation of a reference point spread function $PSF_{ref}(r)$ calculated by means of a Monte-Carlo simulation. This $PSF_{ref}(r)$ function represents the profile of the radial variation of the dose deposited in the stack described above, on a logarithmic scale, versus the radius r corresponding to the distance from the point of incidence of the electron beam.

Figure 2:
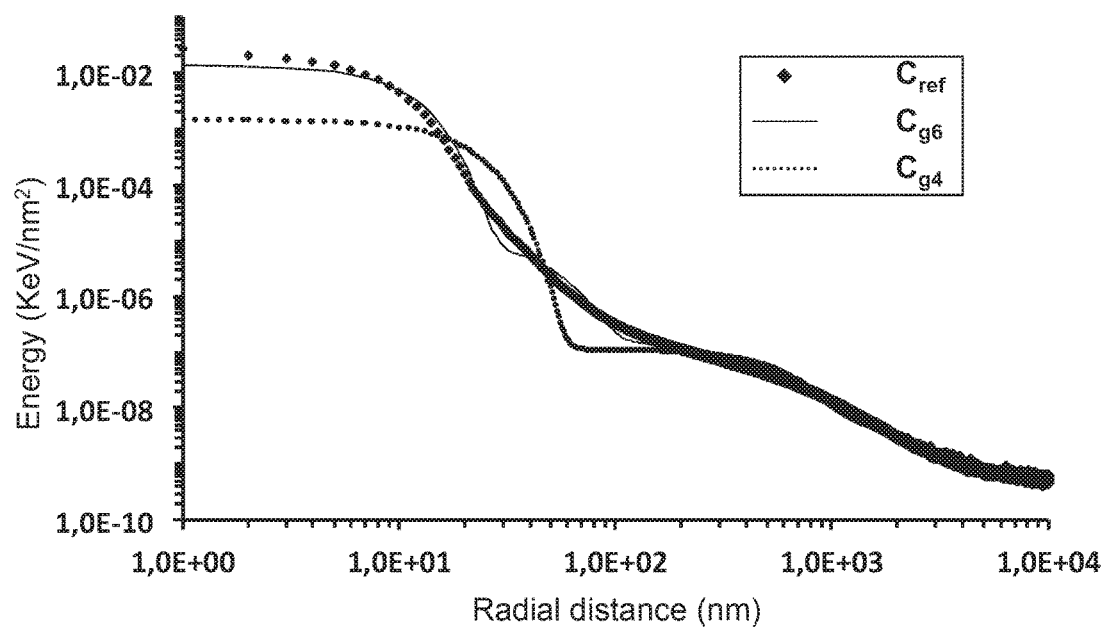
FIG. 2 represents fitting plots of the $PSF_{ref}(r)$ function by two functions respectively defined by a combination of four and six Gaussians.

FIG. 2 illustrates an interpolation or an approximation of the $PSF_{ref}(r)$ function by a function $g(r)$ composed of a combination of Gaussians. The function $g(r)$ can have the following formula:

$$g(r) = \frac{1}{\pi(1 + \Sigma_{1 \le i \le n} \eta_i)} \left( k^2 e^{-k^2 r^2} + \Sigma_{1 \le i \le n} \eta_i k_i^2 e^{-k_i^2 r^2} \right) \qquad (11)$$

where k, $\eta_i$ and $k_i$ constitute the parameters to be optimized to obtain the best interpolation of the $PSF_{ref}(r)$ by the combination of Gaussians $g(r)$.

Furthermore, optimization of the parameters k, $\eta_i$ and $k_i$ for interpolation of the $PSF_{ref}(r)$ function can be performed by any known algorithm able to be used for a local or global optimization. For example purposes, the "Levenberg-Marquardt" algorithm, the "simplex" algorithm, the "kriging" algorithm or methods based on genetic algorithms can be used.

The plot of FIG. 2 comprises curves $C_{ref}$, $C_{g4}$ and $C_{g6}$ respectively corresponding to the $PSF_{ref}(r)$ function, a function $g_4(r)$ composed of a combination of four Gaussians, and a function $g_6(r)$ composed of a combination of six Gaussians. It is clearly observed that, in spite of the use of several Gaussians, the function $g(r)$ is not able to produce an interpolation faithful to the reference point spread function $PSF_{ref}(r)$.

TABLE 1

| Number of Gaussians | Number of optimized variables | Mean quadratic error |
|---|---|---|
| 4 | 7 | 802 |
| 5 | 9 | 508 |
| 6 | 11 | 409 |
| 7 | 13 | 383 |

Table 1 shows the results of the interpolation of the reference point spread function $PSF_{ref}(r)$ by the function g(r) comprising several Gaussians. The quality of the interpolation is quantified by calculation of a variant $D_s$ of the quadratic error. This variant is estimated by the following formula: $D_s=\Sigma_j[\ln(PSF_{ref}(r_j)-\ln(g(r_j)]^2$, where represent the points of the interpolated $PSF_{ref}(r)$ function.

An interpolation using a cubic spline s(r) with natural limit conditions was also performed. By using the definition of a spline described above, the interpolation is performed by optimizing the distribution of the $r_i$ in the interval [a, b] to define the (k−1) sub-intervals $[r_i, r_{i+1}]$ forming the interval [a, b]. By having available the defined $PSF_{ref}(r)$ function on the interval [a, b], and the points $r_i$ (i.e. corresponding $y_i$ points $y_i=PSF_{ref}(r_i)$, the single natural cubic spline s(r) interpolating $PSF_{ref}(r)$ can then be calculated.

As for the function g(r), optimization can be performed by means of a local or global optimization.

Table 2 summarizes the results of the interpolation of the $PSF_{ref}(r)$ function by a natural cubic spline s(r) by varying the number of nodes (k) and optimizing the distribution of the $r_i$ in the interval [a, b].

TABLE 2

| Number of sub-intervals (k-1) | Number of optimized variables (k-2) | Mean quadratic error |
| --- | --- | --- |
| 6 | 5 | 537 |
| 7 | 6 | 409 |
| 8 | 7 | 382 |
| 9 | 8 | 185 |

Figure 3:
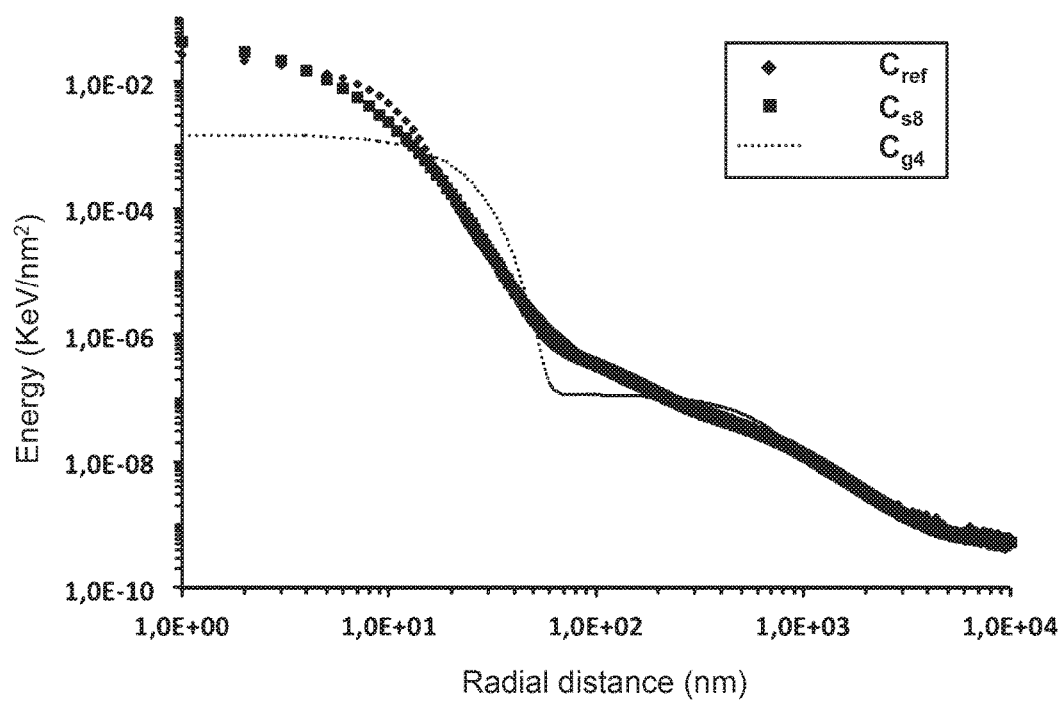
FIG. 3 represents a comparison of two fitting plots of the $PSF_{ref}(r)$ function by a function defined by the combination of four Gaussians, and a natural cubic spline function.

FIG. 3 shows the plot of three curves $C_{ref}$, $C_{g4}$ and $C_{s8}$ respectively corresponding to the $PSF_{ref}(r)$ function, an interpolation of the $PSF_{ref}(r)$ function by the function g(r) composed of a combination of four Gaussians, and an interpolation of the $PSF_{ref}(r)$ function by a natural cubic spline using nine nodes. It can be clearly observed that for the same number of parameters to be optimized (7), the natural cubic spline function enables a better interpolation of the $PSF_{ref}(r)$ function to be had than a combination of four Gaussians does.

Furthermore, comparison of the results of tables 1 and 2 also shows that the natural cubic spline functions advantageously enable a better interpolation than the functions based on a combination of Gaussians. Indeed, for the same number of parameters to be optimized to interpolate the $PSF_{ref}(r)$ function, the variant $D_s$ of the quadratic error is lower for the splines than for the combination of Gaussians.

For an interpolation with a natural cubic spline using 8 intervals, in other words respectively optimizing 7 coefficients, the quadratic error is 48% lower in comparison with an interpolation with a combination of four Gaussians ($g_4(r)$).

In an alternative embodiment, the piecewise polynomial function is defined by coefficients ($\alpha_{i,j}$) and the coefficients are chosen such as to optimize interpolation of the experimental results representing the scattering of the electrons originating from the electron beam in the target, by the radial variation of the point spread function. In certain cases, the measurements are not direct measurements of the scattering, and dimensional measurements are then for example used.

A radial variation of the point spread function of piecewise polynomial function type is advantageously easy to parameterize and to compute. Furthermore, a piecewise polynomial function enables a more precise interpolation than an interpolation by a combination of Gaussians, and further uses a limited number of parameters to be optimized. In addition, it is easier to compute a convolution or a deconvolution from polynomial functions than from Gaussian functions, which facilitates calculations for correction of the electron scattering effects in a target.

For a controlled use of an incident electron beam on a target in a lithography system, a lithography device is provided advantageously coupled with a computing module configured to correct the electron scattering effects in a target.

According to one embodiment, an electron beam lithography device comprises a module for accelerating and projecting an electron beam onto a target. The acceleration and projection module is advantageously coupled with a computing module configured to correct the electron scattering effects in said target. Preferably, the computing module is comprised in the lithography device. Furthermore, said computing module can be independent from said device.

The computing module is configured to calculate a point spread function having a radial variation according to a piecewise polynomial function. This computation is performed so as to optimize the distribution of the dose deposited in the target and/or the geometry of the target receiving the electron beam.

Optimization of the distribution of the deposited device can be performed by a mathematical convolution operation of the point spread function and of a function representing the geometric shape of the pattern to be etched: in other words a function defining a pattern of a global architecture which is sought to be achieved from the target. Advantageously, the point spread function implemented in the computing module is a piecewise cubic polynomial function.

According to an example embodiment, a usual electron beam lithography device of SB 3054 type from the VISTEC™ company, or of EBM6000, EBM8000 type from the NuFlare company, or of JBX3040, JBX3200 type from the Jeol company can be used. This type of device enables a direct projection of an electron beam onto a substrate, or enables a pattern to be made on a mask. Correction of the electron scattering by this type of device can be performed according to the invention by modifying the computing module of this device, in particular comprising the software for performing adjustment of the dose distributed in the target.

The computing module using the software of PROX-ECCO™ trademark distributed by the VISTEC™ company, or the Inscale™ software distributed by the Aselta Nanographics™ company can for example be modified. Modification of these computing modules in particular consists in replacing the back scattering PSF function of the prior art by the PSF having a radial variation in the form of a spline as described in the foregoing.

Correction of the electron scattering is then performed by modulation of the dose deposited in the target, and/or of the geometry of the target receiving the electron beam. This modulation can comprise a computing step by convolution of the spline defining the PSF, for example a natural cubic spline, and a function describing the geometry of the pattern to be etched.

The computing module can also be adapted to perform a simulation of one or more steps of an electron beam lithography method. This computing module can further be advantageously used in a method for analysing a solid target using the electron beam as incident beam. Analysis of a signal re-emitted by the target and resulting from the interaction between the target and the incident beam can then provide information in particular on the topography or the composition of the target.

Thus, for an optimized use of an incident electron beam on a target in an analysis system of the target, an electron microscopy device is provided further comprising a computing device configured to correct the electron scattering in the target.

According to a particular embodiment, an electron microscopy device comprises a module for accelerating and projecting an incident electron beam onto a target, and a display module of a signal describing the target.

Furthermore, the device can be a scanning, field effect or tunnel effect electron microscopy device, or any other device able to be used in imagery or to perform an analysis, in particular of a sample of a substrate or of a mask.

The electron microscopy device further comprises a computer configured to optimize a global point spread function of the device from correction of the electron scattering effects in the target. Advantageously, this correction of the incident electron scattering effects in the target comprises a step of calculating an additional point spread function having a radial variation according to a piecewise polynomial function.

In order to obtain a signal describing the characteristics of the target with precision, the device is provided with a processing model of the re-emitted signal resulting from the interaction of the incident electron beam with the target.

Advantageously, the signal processing model is configured to correct the signal describing the target from the re-emitted signal and the optimized global point spread function. In general, correction is performed by deconvolution of the signal re-emitted by the target and said global point spread function.

The invention claimed is:

1. A method for projecting an electron beam onto a target comprising:
   correcting, at an electron beam lithography system, electron scattering effects in the target,
   wherein:
      the correction of the electron scattering effects in the target comprises calculating a point spread function modelling an interaction of the electron beam with the target, wherein the point spread function models a radial variation of an energy of the electron beam or a dose of the electron beam deposited in the target by means of a piecewise polynomial function that defines an interval that is divided into at least two sub-intervals, each sub-interval being associated with a polynomial function different from another polynomial function associated with adjacent sub-interval.

2. The method according to claim 1, wherein the correction of the electron scattering effects in the target comprises modulation of the dose of the electron beam deposited in the target.

3. The method according to claim 1, wherein the correction of the electron scattering effects in the target comprises modulation of a geometry of a portion of the target receiving the electron beam.

4. The method according to claim 2, wherein the correction of the electron scattering effects in the target comprises modulation of a geometry of a portion of the target receiving the electron beam.

5. The method according to claim 1, wherein the radial variation of the point spread function is a piecewise cubic polynomial.

6. The method according to claim 2, wherein the radial variation of the point spread function is a piecewise cubic polynomial.

7. The method according to claim 3, wherein the radial variation of the point spread function is a piecewise cubic polynomial.

8. The method according to claim 4, wherein the radial variation of the point spread function is a piecewise cubic polynomial.

9. The method according to claim 5, wherein the radial variation of the point spread function is defined over an interval [a, b] belonging to the set of real numbers $\mathbb{R}$, and in that the radial variation complies with the limit conditions called natural conditions so that the second derivatives of the radial variation at the ends of the interval [a, b] are zero.

10. The method according to claim 1, wherein the piecewise polynomial function is defined by coefficients $\alpha_{i,j}$, said coefficients $\alpha_{i,j}$ being chosen to optimize interpolation of the result of a reference probabilistic simulation of the electron scattering originating from the electron beam in the target, by the radial variation of the point spread function.

11. The method according to claim 1, wherein the piecewise polynomial function is defined by coefficients $\alpha_{i,j}$, said coefficients $\alpha_{i,j}$ being chosen to optimize interpolation of the experimental results representing scattering of the electrons originating from the electron beam in the target, by the radial variation of the point spread function.

12. An electron beam lithography device comprising:
   a module for accelerating and projecting an electron beam onto a target; and
   a computing module configured to correct the electron scattering effects in the target;
   wherein:
      the computing module is configured to calculate a point spread function modelling an interaction of the electron beam with the target, wherein the point spread function models a radial variation of an energy of the electron beam or a dose of the electron beam deposited in the target by means of a piecewise polynomial function so as to optimize a distribution of the dose of the electron beam deposited in the target and/or a geometry of a portion of the target receiving the electron beam, and
      the piecewise polynomial function defines an interval that is divided into at least two sub-intervals, each sub-interval being associated with a polynomial function different from another polynomial function associated with adjacent sub-interval.

13. The electron beam lithography device according to claim 12, wherein the computing module is configured to optimize the distribution of the dose deposited in the target by a calculation comprising a convolution of the point spread function and of a geometry of a pattern to be etched.

14. A method for forming a pattern in a resist layer covering a substrate by projecting an electron beam onto the resist layer, the method comprising:
   performing, by means of a computer, a convolution step or a deconvolution step using a point spread function modelling an interaction of the electron beam with the resist layer, wherein the point spread function models a radial variation of an energy of the electron beam or a dose of the electron beam deposited in the resist layer by means of a piecewise polynomial function, to produce correction data; and
   correcting, at an electron beam lithography system, electron scattering effects in a target on a basis of the correction data, wherein the piecewise polynomial function defines an interval that is divided into at least two sub-intervals, each sub-interval being associated with a polynomial function different from another polynomial function associated with adjacent sub-interval.

* * * * *